United States Patent [19]

Chan et al.

[11] Patent Number: 4,983,804
[45] Date of Patent: Jan. 8, 1991

[54] LOCALIZED SOLDERING BY INDUCTIVE HEATING

[75] Inventors: Hinghung A. Chan, Piscataway; Michael A. Oien, Chatham, both of N.J.

[73] Assignee: AT&T Bell Laboratories, Murray Hill, N.J.

[21] Appl. No.: 454,331

[22] Filed: Dec. 21, 1989

[51] Int. Cl.$^5$ .............................. H05B 6/10; B23K 1/00
[52] U.S. Cl. ................................ 219/85.11; 219/10.41; 219/9.5; 219/10.71
[58] Field of Search .............. 219/85.11, 10.41, 10.43, 219/9.5, 8.5, 10.53, 10.71, 10.75, 10.79; 228/180.1, 180.2

[56] References Cited

U.S. PATENT DOCUMENTS

| | | | |
|---|---|---|---|
| 2,762,892 | 9/1956 | Park | 219/8.5 |
| 3,467,806 | 9/1969 | Dixon | 219/9.5 |
| 4,327,265 | 4/1982 | Edinger et al. | 219/85.11 |
| 4,431,891 | 2/1984 | Forstner et al. | 219/9.5 |
| 4,642,442 | 2/1987 | Mullane et al. | 219/10.41 |
| 4,659,912 | 4/1987 | Derbyshire | 219/535 |
| 4,749,833 | 6/1988 | Novorsky et al. | 219/85.11 |
| 4,771,151 | 9/1988 | Pursell | 219/9.5 |
| 4,789,767 | 12/1988 | Doljack | 219/9.5 |
| 4,795,870 | 1/1989 | Krumme | 219/9.5 |
| 4,806,107 | 2/1989 | Arnold et al. | 439/79 |

Primary Examiner—Philip H. Leung
Attorney, Agent, or Firm—L. H. Birnbaum

[57] ABSTRACT

Disclosed is a method for selective soldering of components by inductive heating. A ferromagnetic material is provided as part of the components so that an applied electromagnetic field will create sufficient heat to melt the solder. The Curie temperature of the material is chosen to be just above the melting temperature of the solder to regulate the amount of heating.

13 Claims, 7 Drawing Sheets

LOCALIZED SOLDERING BY INDUCTIVE HEATING

BACKGROUND OF THE INVENTION

This invention relates to soldering of electronic components.

In the fabrication of many types of electronic components, it is desirable to solder only localized areas without disturbing other components which may be mounted on the same circuit board. For example, one form of high performance connector uses a flexible circuit which is soldered to a completed circuit board (see, e.g., U.S. Pat. No. 4,806,107 issued to Arnold, et al). Further, in the assembly of printed circuit boards, repair of one or more components is often necessary, which involves a re-soldering of the repaired component. In addition, the mounting of selected surface-mounted components on the board is advantageously done by localized heating, especially when the component has a high number of I/O pins.

Some techniques for localized heating are presently available. For example, a hot ram can be used to solder a flexible circuit to a circuit board (see, e.g., Clark, et al, U.S. patent application Ser. No. 372,400, filed Jun. 27, 1989 and assigned to the present assignee). Such techniques may or may not provide sufficient heat regulation for sensitive components. Inductive heating has also been suggested, where a bus bar soldered to a board includes ferromagnetic pins with coils wrapped around the pins (see U.S. Pat. No. 4,795,870) or where the leads of a multipin component are coated with a ferromagnetic material and placed in the gap of a ferrite core (see U.S. Pat. No. 4,789,767). The ferromagnetic material has a Curie temperature which is chosen to provide self-regulated heating.

Other techniques, such as condensation soldering can be self-regulating, but cannot be applied locally. Even in the cases of prior inductive heating techniques, difficulty can be encounted in providing heat to pads which are made inaccessible by high I/O components.

It is, therefore, an object of the invention to provide an alternative method for selective soldering of electronic components.

SUMMARY OF THE INVENTION

This and other objects are achieved in accordance with the invention which is a method of selectively soldering the conductive members of an electronic component to conductive members on a substrate having two major surfaces. A ferromagnetic material is provided in the vicinity of the conductive members to be soldered, and solder is also provided to the members. The ferromagnetic material has a Curie temperature above the melting temperature of the solder. An electromagnetic field is applied to the ferromagnetic material by means of a pair of coils remote from the material with a coil opposite each major surface of the substrate so as to inductively heat the material to a temperature sufficient to melt the solder.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
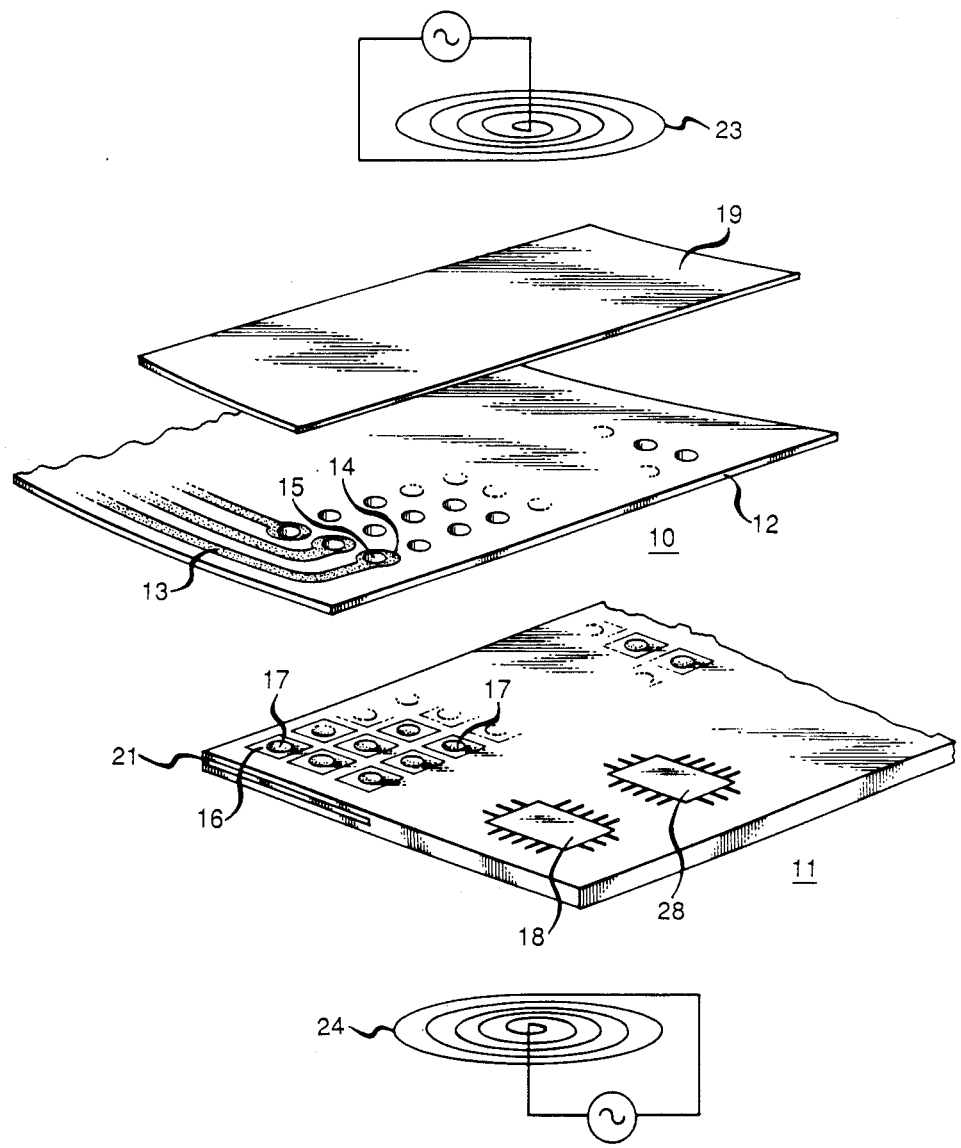
FIG. 1 is a schematic illustration of the soldering of a flexible circuit to a printed circuit board in accordance with an embodiment of the invention.
Figure 2:
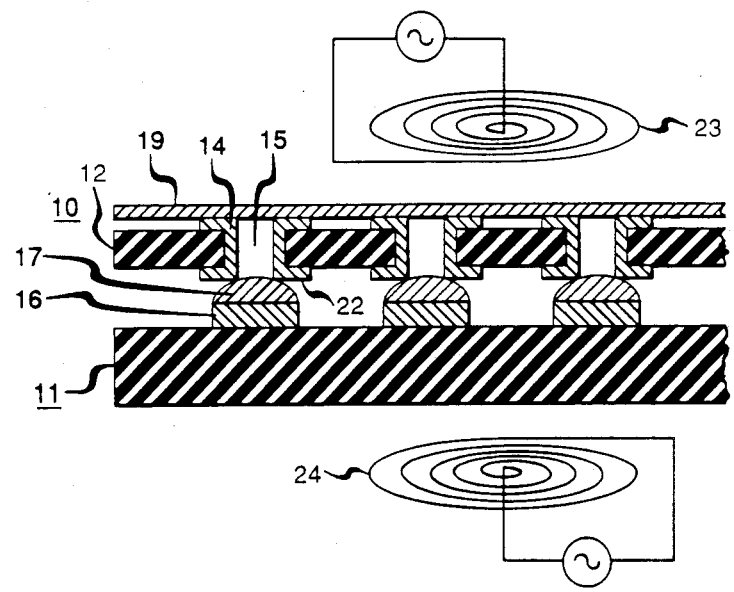
FIG. 2 is another view of the elements shown in FIG. 1.

One embodiment of the invention is shown in the partly schematic, exploded view of FIG. 1 and in the cross-sectional view of FIG. 2. In this example, it is desired to solder a flexible circuit, 10, to a printed circuit board, 11. The flexible circuit includes a thin insulating layer, 12, such as polyimide, upon which are deposited conductive paths, e.g., 13, typically comprising copper (only three such paths are shown for illustrative purposes). Each path terminates in a conductive pad area, e.g., 14, which includes a metallized hole, 15, therethrough to connect to a corresponding pad (22 of FIG. 2) on the other side of the insulating layer, 12. Each metallized hole and associated pads are to be bonded to a corresponding conductive pad area, such as 16, on the printed circuit board, 11. For that purpose solder mounds, e.g., 17, are deposited onto each pad by known techniques (see, e.g., Clark et al, U.S. patent application Ser. No. 372,400 filed Jun. 27, 1989, and assigned to the present assignee). The printed circuit board, 11, also includes a plurality of integrated circuit chip packages, two of which are illustrated as 18 and 28. The packages have been previously soldered to pads on the board by known techniques, and it is desired not to disturb the solder joints thus formed during the attachment of the flexible circuit. Consequently, heating should be localized to the areas of the pads, 14, 16, and 22, on the flexible circuit and circuit board.

In order to accomplish this localized heating, it is proposed that a ferromagnetic element of a particular type be provided in the vicinity of the pads to be soldered. Two possibilities are illustrated in FIG. 1. For example, a sheet, 19, of magnetic material can be provided on the surface of the flex circuit, either covering only the area of the pads, 14, as shown or covering the entire surface. The layer, 19, which would be approximately 0.2 mm thick, could be removed from the flexible circuit after soldering. Another alternative is to use a ferromagnetic material in the form of a strip and embed it in the circuit board, as shown by the phantom lines, 21.

Figure 3:
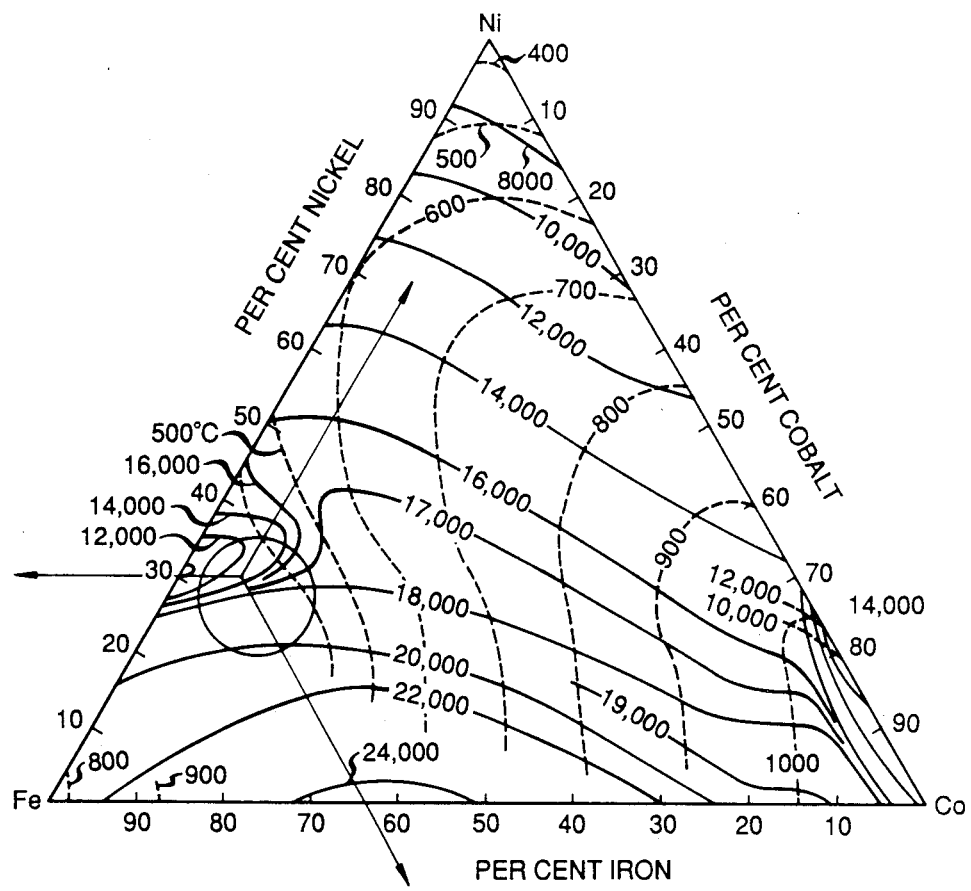
FIG. 3 is a diagram illustrating the composition of a ferromagnetic material useful in accordance with an embodiment of the invention.

The ferromagnetic material is chosen to have a Curie temperature slightly above the melting point of the solder for reasons discussed below. In a typical example, the solder is a lead-tin alloy with a melting temperature of approximately 190 degrees C. The Curie temperature is, therefore, preferably in the range 200–400 degrees C. Also, in order to ensure adequately short heating times (typically, less than 20 seconds), it is desirable to choose a material with a high saturation field, preferably in the range 1 to 2 Tesla. FIG. 3 illustrates a composition chart for an alloy of nickel, iron and cobalt with the solid line curves indicating saturation fields and the broken line curves showing Curie temperatures. A desirable composition falls within the circle, with a particular example shown as 30 percent nickel, 63 percent iron and 7 percent cobalt. The generally useful ranges are 20 to 35 percent nickel, 2 to 20 percent cobalt, and 50 to 75 percent iron.

Returning to FIGS. 1 and 2, the flexible circuit is soldered to the printed circuit board by bringing the pads, e.g., 22, on the underside of the flex circuit into contact with the solder mounds, e.g., 17. An alternating current of opposite polarity is then supplied to two planar coils, 23 and 24, located above and below the flex circuit and circuit boards. This produces an electromagnetic field which inductively heats the ferromagnetic material, 19 or 21, sufficiently to cause the solder in the vicinity of the material to melt. That is, solder on the pads such as 16 which are typically approximately 0.5 mm or less from the material, 19, will melt and form a solder joint with the flexible circuit, while the solder bonding components, 18 and 28, typically approximately 1 cm or more from the material, will be unaffected. The ferromagnetic material will continue to heat up until its Curie temperature is reached, at which time it will lose its magnetic properties along with its inductive heating capabilities. Thus, the operation is self-regulating. By supplying opposite polarity current to the pair of coils, 23 and 24, the localized nature of the heating is enhanced since the field from each coil will add up in the space between the coils but will tend to cancel each other outside this area.

Figure 5:
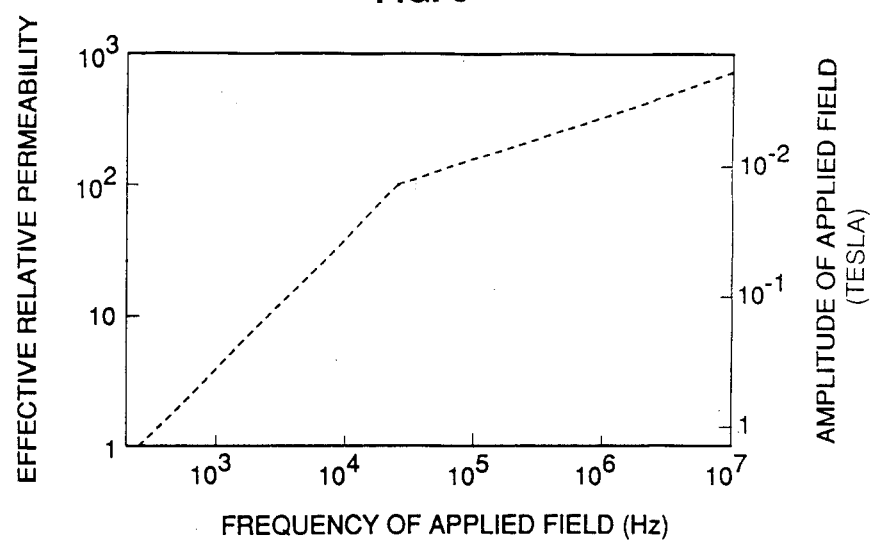
FIGS. 5–8 are graphs illustrating various parameters in accordance with the embodiment illustrated in FIG. 1.
Figure 6:
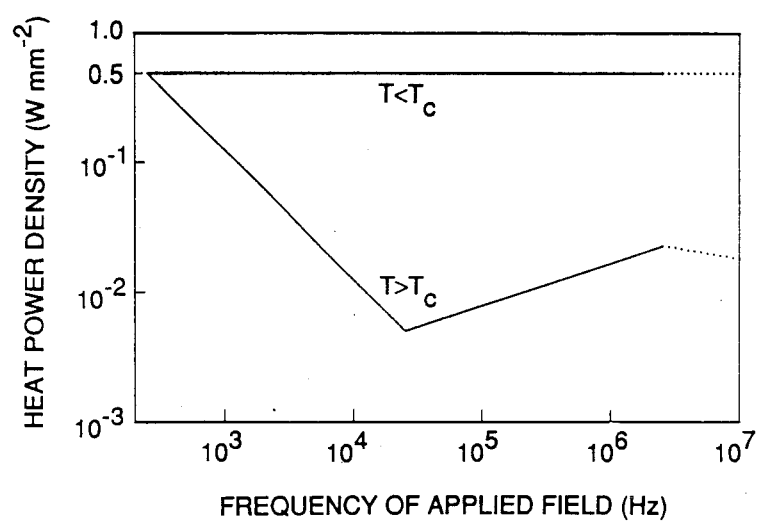

In a particular example of bonding a flexible circuit to a circuit board, it is assumed that the ferromagnetic material has a thickness of 0.2 mm and the goal is to achieve a power density of 0.5 watts/mm$^2$ using a saturation field of 2 Tesla. FIGS. 5-8 are log-log plots based on calculations of various parameters. FIG. 5 shows effective relative permeability (the field produced in the magnetic material divided by the applied magnetic field) and the amplitude of the applied magnetic field as a function of the frequency of the applied electromagnetic field for the desired density of 0.5 watts/mm$^2$. FIG. 6 illustrates the heat power density as a function of the frequency of the applied electromagnetic field. For temperatures below the Curie temperature (T<T$_c$) the desired 0.5 watts/mm$^2$ is shown. However, when the temperature exceeds the Curie temperature (T>T$_c$), the heat power density will first drop considerably as the frequency is increased, and then rise. The desired frequency is the range generating the greatest difference between the two curves, which in this case is approximately 10$^4$ to 10$^5$ Hz.

Figure 7:
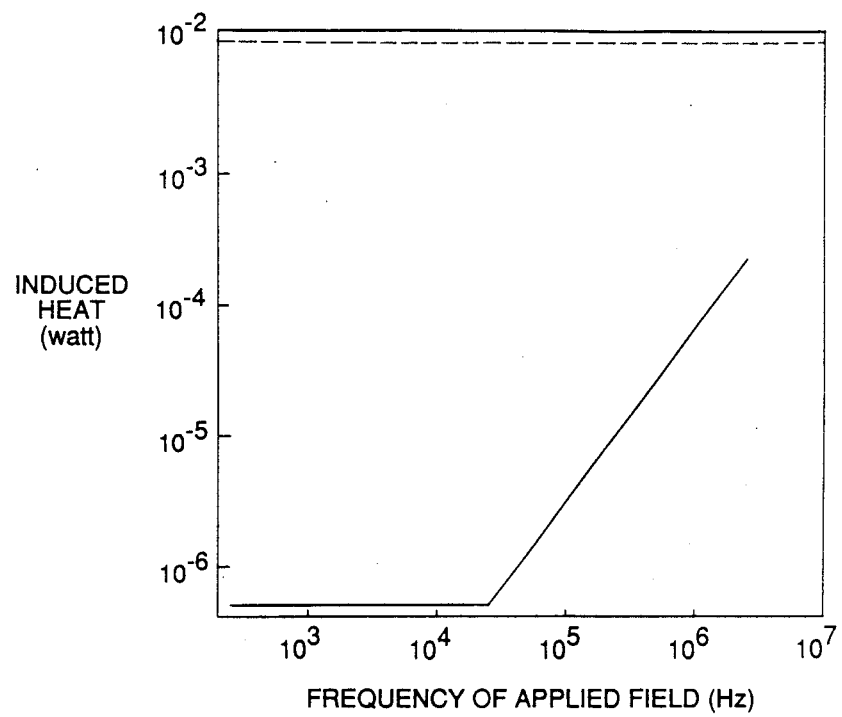
Figure 8:
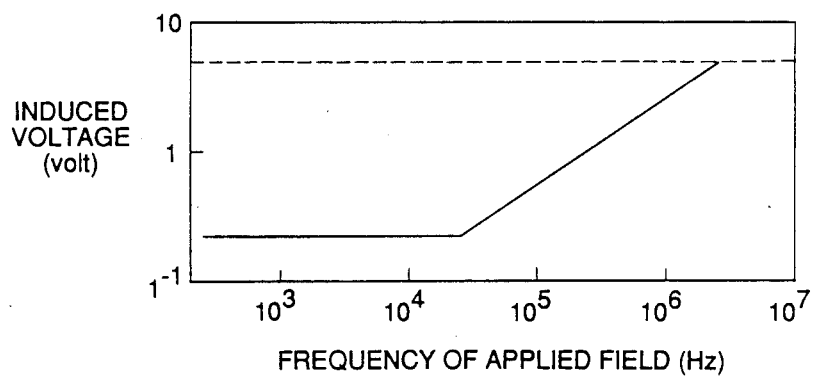

An important consideration in this technique is to prevent damage to other sensitive components on the board. FIG. 7, therefore, shows the calculated induced heat of a 1 mm×1 mm closed-loop with a sensitive junction having a resistance of 10 ohms. A safe heat level is assumed to be 10 milliwatts as shown by the dashed line curve. Consequently, a field of 10$^4$ to 10$^5$ Hz should not create a problem. In FIG. 8, the induced voltage is calculated for a 10 mm×10 loop containing a capacitive element of low breakdown voltage (5 volts as indicated by the dashed line curve). Again, the regime of 10$^4$ to 10$^5$ Hz should be adequate to prevent excessive induced voltages based on this model.

Figure 4:
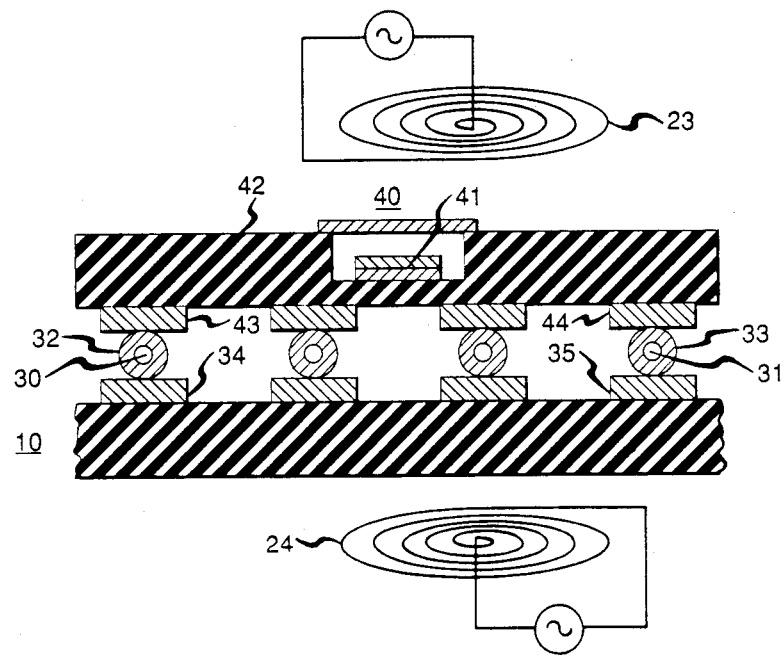
FIG. 4 is a schematic illustration of the soldering of a surface-mounted component to a printed circuit board in accordance with a further embodiment of the invention.

As illustrated in FIG. 4, rather than using a layer or strip of ferromagnetic material incorporated on or in one of the components, the material can be incorporated in the solder itself. As shown, the material, e.g., 30 and 31, can be provided in the form of spheres embedded within solder balls, e.g., 32 and 33. The balls can be deposited on conductive pads, e.g., 34 and 35, situated on the printed circuit board, 10. This embodiment is particularly useful for bonding surface-mounted components, such as, for example, 40, which includes an IC chip, 41, mounted within a ceramic package, 42. The chip is electrically coupled to pads, e.g., 43 and 44, on the bottom surface of the package which are bonded to the pads on the circuit board. When an electromagnetic field is applied by coils, 23 and 24, as before, the ferromagnetic material will heat up and cause the solder to melt, thereby bonding the package pads, e.g., 43 and 44, to the pads, e.g., 34 and 35, on the circuit board. This technique is especially advantageous for high I/O area distributed surface-mounted packages (e.g., greater than 100) since the pads are covered by the package thereby making physical access to the pad areas very difficult. Here, however, the heating is easily localized to the pads by the inductive heating of the ferromagnetic balls, 30 and 31.

Figure 9:
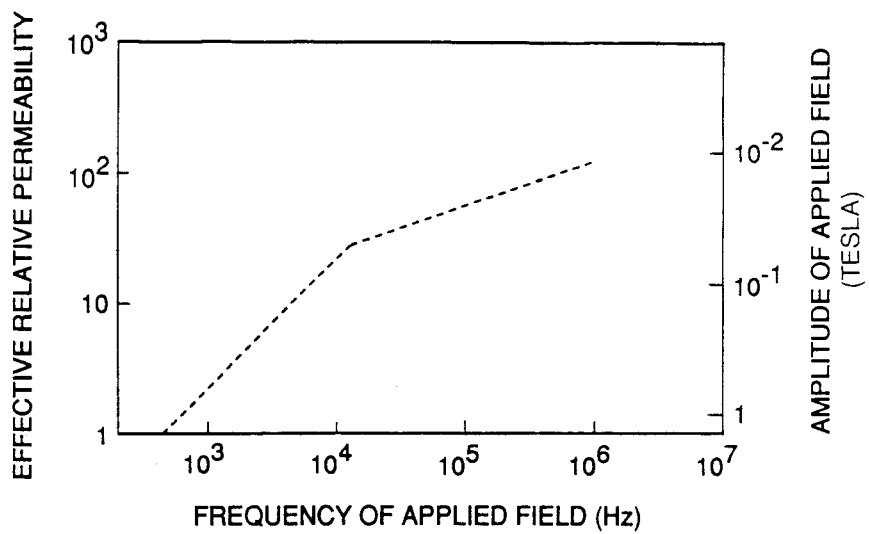
FIGS. 9–12 are graphs illustrating various parameters in accordance with the embodiment of FIG. 4.
Figure 10:
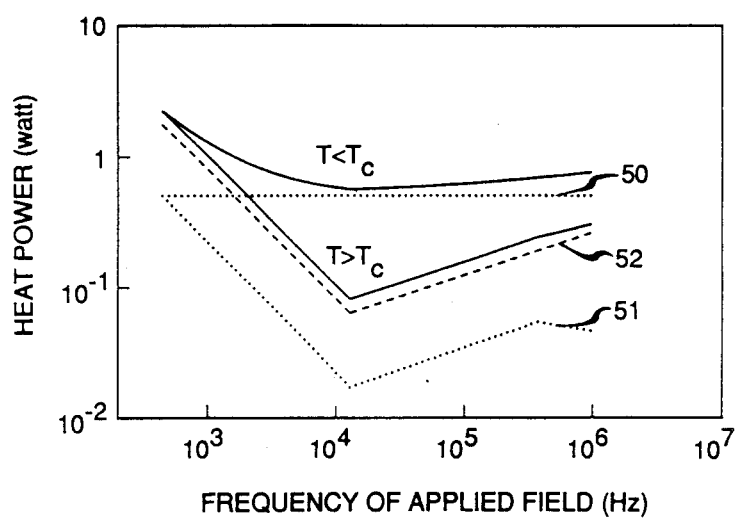

In more detail, it might typically be assumed that the solder balls have a 1 mm diameter and the ferromagnetic material has a diameter of 0.6 mm. Again, the goal is to achieve a heating power of 0.5 watts per solder ball. FIG. 9 gives a plot of calculated values for the effective relative permeability and applied magnetic field as a function of frequency of the applied field for a heating power of 0.5 watts per solder joint. Because the magnetic cores are embedded inside the solder, the applied electromagnetic fields will be shielded at high frequencies (above 10$^6$ Hz in this example). Since the solder is metallic, it will generate heat that should be taken into account. Thus, FIG. 10 shows calculated values of heat power as a function of the frequency of the applied field for the magnetic core alone below the Curie temperature (dotted curve, 50) and above the Curie temperature (dotted curve, 51), as well as for the solder alone (dashed curve, 52). The solid line curves give the combined heat from the core and solder below the Curie temperature (T<T$_c$) and above the Curie temperature (T>T$_c$).

Figure 11:
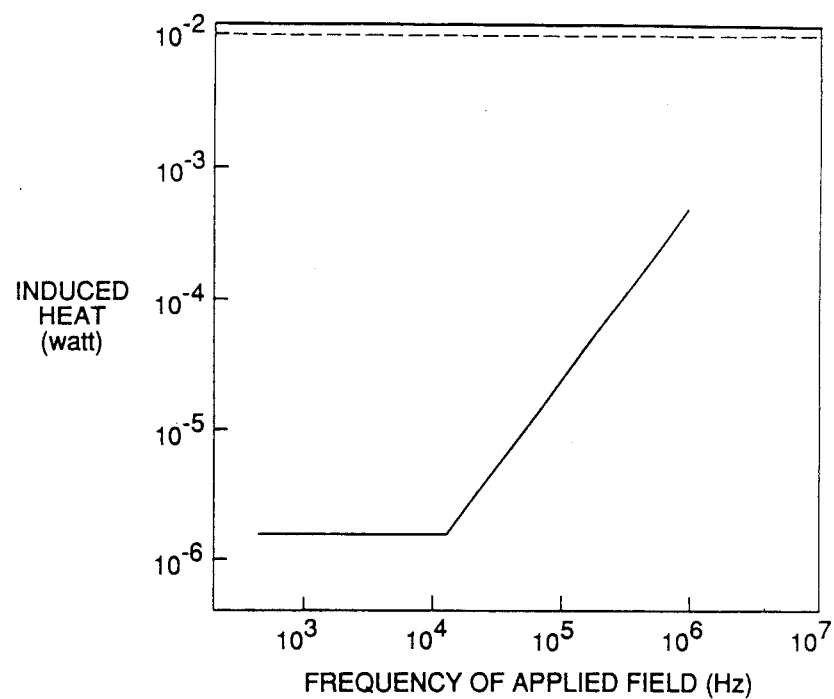
Figure 12:
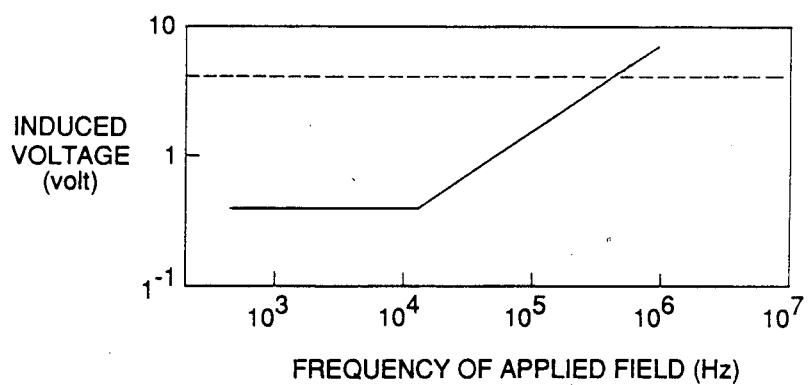

Again, the desired frequency is the range which produces the greatest difference between the heat below and above the Curie temperature provided undue heat or voltages are not induced in nearby sensitive components. FIG. 11, therefore, illustrates the heat generated in a loop 1 mm×1 mm and having a junction resistance of approximately 10 ohms (solid curve). As in the previous example, it is assumed that a safe heat level is 10$^{-2}$ watts (dashed curve). FIG. 12 gives the calculated induced voltage for a loop of 10 mm×10 mm containing a capacitive element with a breakdown voltage of 5 volts (solid curve). The dashed curve indicates the safe level of 5 volts.

On the basis of curves in FIGS. 9-12, therefore, the optimum applied field has a frequency in the range of approximately 5×10$^3$ to 2×10$^5$ Hz. In order to get sufficient differentiation between heat generated below and above the Curie temperature, it is recommended that the ferromagnetic material be at least one quarter of the total volume of the solder bump and magnetic core combination.

Various additional modifications of the invention will become apparent to those skilled in the art. For example, in the embodiment illustrated in FIG. 4, it might be desirable to make the package pads (e.g., 43 and 44) from the ferromagnetic material rather than embed the material in the solder as shown. Alternatively, a layer of ferromagnetic material could be deposited in the bottom surface of the package adjacent to the pads. All such variations, which basically rely on the teachings through which the invention has advanced the art are properly considered within the scope of the invention.

We claim:

1. A method of selectively soldering conductive elements on an electronic component to conductive elements on a substrate having two major surfaces comprising the steps of:
   providing solder to the elements to be soldered;
   providing a ferromagnetic material within 0.5 mm of the elements to be soldered, the ferromagnetic material having a Curie temperature in the range 200–400 degrees C and having a saturation field of at least 1 Tesla; and
   applying an electromagnetic field with a frequency in the range $5 \times 10^3$ to $2 \times 10^5$ Hz to the ferromagnetic material by means of a pair of coils detached from the material with a coil opposite each major surface of the substrate so as to inductively heat said material to a temperature sufficient to melt the solder.

2. The method according to claim 1 wherein the ferromagnetic material is provided within the solder.

3. The method according to claim 2 wherein the component comprises a package for a semiconductor chip and the elements to be soldered comprise conductive pads on said package.

4. The method according to claim 3 wherein the ferromagnetic material is a sphere embedded within a solder mound provided between each pad on the package and pad on a printed circuit board.

5. The method according to claim 4 wherein the volume of the sphere is at least one quarter of the total volume of the ferromagnetic material and solder.

6. The method according to claim 1 wherein the ferromagnetic material is a layer placed in contact with the component.

7. The method according to claim 1 wherein the ferromagnetic material is embedded within the substrate.

8. The method according to claims 6 or 7 wherein the component is a flexible circuit and the substrate is a printed circuit board.

9. The method according to claims 6 or 7 wherein the electromagnetic field has a frequency within the range $10^4$ to $10^5$ Hz.

10. The method according to claim 1 wherein the ferromagnetic material comprises an alloy of iron, cobalt, and nickel.

11. The method according to claim 10 wherein the alloy comprises 50 to 75 percent iron, 2 to 20 percent cobalt, and 20 to 35 percent nickel.

12. A method of selectively soldering conductive elements on an electronic component to conductive elements on a substrate comprising the steps of:
    providing a ferromagnetic material within solder mounds and providing said mounds to the said conductive elements, the ferromagnetic material having a Curie temperature within the range 200–400 degrees C and a saturation field of at least 1 Tesla; and
    applying an electromagnetic field with a frequency in the range $5 \times 10^3$ to $2 \times 10^5$ Hz to the ferromagnetic material by means of a pair of coils detached from the material so as to inductively heat said material to a temperature sufficient to melt the solder.

13. A method of selectively soldering conductive elements on an electronic component to conductive elements on a substrate comprising the steps of:
    providing a planar sheet of ferromagnetic material in contact with one of said component or substrate, and providing solder to said conductive elements, the ferromagnetic material having a Curie temperature within the range 200–400 degrees C and a saturation field of at least 1 Tesla; and
    applying an electromagnetic field with a frequency in the range $10^4$ to $10^5$ Hz to the ferromagnetic material by means of a pair of coils detached from the material so as to inductively heat said material to a temperature sufficient to melt the solder.

* * * * *